United States Patent
Hussell

(10) Patent No.: US 9,806,246 B2
(45) Date of Patent: Oct. 31, 2017

(54) CERAMIC-BASED LIGHT EMITTING DIODE (LED) DEVICES, COMPONENTS, AND METHODS

(71) Applicant: CREE, Inc., Durham, NC (US)

(72) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/836,709

(22) Filed: Mar. 15, 2013

(65) Prior Publication Data

US 2013/0200420 A1 Aug. 8, 2013

Related U.S. Application Data

(63) Continuation-in-part of application No. 13/367,929, filed on Feb. 7, 2012, and a continuation-in-part of
(Continued)

(51) Int. Cl.
*H01L 33/64* (2010.01)
*H01L 33/48* (2010.01)
*H01L 33/60* (2010.01)

(52) U.S. Cl.
CPC .......... *H01L 33/641* (2013.01); *H01L 33/486* (2013.01); *H01L 33/60* (2013.01);
(Continued)

(58) Field of Classification Search
CPC ... H01L 33/486; H01L 33/641; H01L 33/642; H01L 33/60; H01L 25/0753; H01L 25/167; H01L 33/52
(Continued)

(56) References Cited

U.S. PATENT DOCUMENTS 4,946,547 A 8/1990 Palmour
5,200,022 A 4/1993 Kong
(Continued)

FOREIGN PATENT DOCUMENTS

CN 101794855 8/2010
JP 06-291236 10/1994
(Continued)

OTHER PUBLICATIONS

Final Office Action for U.S. Appl. No. 13/836,940 dated Feb. 16, 2016.
(Continued)

*Primary Examiner* — David Vu
*Assistant Examiner* — Mouloucoulaye Inoussa
(74) *Attorney, Agent, or Firm* — Jenkins, Wilson, Taylor & Hunt, P.A.

(57) ABSTRACT

A light emitter device component containing one or more light emitter devices, such as light emitting diodes (LEDs) or LED chips, can include a body that can be ceramic and have a top surface, one or more light emitting devices mounted directly or indirectly on the top surface, and one or more electrical components mounted on the top surface and electrically coupled to the one or more light emitting devices. At least a portion of the top surface of the body to which the light emitting devices are mounted can be modified to have a reduced porosity compared to an as-fired ceramic body. Such components can result in improved adhesion strength and thermal management of the light emitting devices.

13 Claims, 5 Drawing Sheets

Related U.S. Application Data application No. 13/436,247, filed on Mar. 30, 2012, now Pat. No. 8,895,998.

(60) Provisional application No. 61/737,568, filed on Dec. 14, 2012.

(52) U.S. Cl.
CPC .. *H01L 33/642* (2013.01); *H01L 2224/48091* (2013.01); *H01L 2224/48137* (2013.01); *H01L 2224/48227* (2013.01); *H01L 2924/181* (2013.01)

(58) Field of Classification Search
USPC ..... 257/98, 99, 100, 431, E21.592, E33.072, 257/E21.009, E21.054, E23.09, 243; 313/498, 506; 438/7, 27, 698
See application file for complete search history.

(56) References Cited

U.S. PATENT DOCUMENTS

| | | | |
|---|---|---|---|
| RE34,861 E | 2/1995 | Davis | |
| 5,493,393 A | 2/1996 | Beranek et al. | |
| 6,600,175 B1 | 7/2003 | Baretz et al. | |
| 6,795,461 B1 | 9/2004 | Blair et al. | |
| 6,874,910 B2 | 4/2005 | Sugimoto et al. | |
| 7,329,942 B2 | 2/2008 | Tsou et al. | |
| 7,391,046 B2 | 6/2008 | Tsutsumi et al. | |
| 7,714,334 B2 | 5/2010 | Lin | |
| D626,666 S | 11/2010 | Yamamoto et al. | |
| D640,997 S | 7/2011 | Imai et al. | |
| 7,989,840 B2 | 8/2011 | Sanpei et al. | |
| 8,018,135 B2 | 9/2011 | Van de Ven et al. | |
| 8,058,088 B2 | 11/2011 | Cannon | |
| 8,115,369 B2 | 2/2012 | Kang et al. | |
| 8,167,674 B2 | 5/2012 | Hussell et al. | |
| 8,188,687 B2 | 5/2012 | Lee et al. | |
| 8,304,660 B2 | 11/2012 | Tuan et al. | |
| 8,408,748 B2 | 4/2013 | Janik et al. | |
| 8,410,679 B2 | 4/2013 | Ibbetson et al. | |
| 8,425,271 B2 | 4/2013 | Hussell et al. | |
| 8,456,739 B2 | 6/2013 | Stuettler et al. | |
| 8,476,836 B2 | 7/2013 | Van de Ven et al. | |
| 8,508,140 B2 | 8/2013 | Leung et al. | |
| 8,564,000 B2 | 10/2013 | Hussell et al. | |
| 8,575,639 B2 | 11/2013 | Hussell | |
| 8,624,271 B2 | 1/2014 | Reiherzer et al. | |
| D699,387 S | 2/2014 | Snell | |
| D700,737 S | 3/2014 | Campagna | |
| D702,653 S | 4/2014 | Wilcox et al. | |
| 8,704,446 B2 | 4/2014 | Gibbs | |
| D705,181 S | 5/2014 | Hussell et al. | |
| 8,766,313 B2 | 7/2014 | Kashitani et al. | |
| D714,989 S | 10/2014 | Rowlette, Jr. | |
| 8,895,998 B2 | 11/2014 | Hussell et al. | |
| D724,550 S | 3/2015 | Song | |
| D724,552 S | 3/2015 | Lai et al. | |
| 8,975,821 B2 | 3/2015 | Gershowitz et al. | |
| 9,024,349 B2 | 5/2015 | Chitnis et al. | |
| 9,024,350 B2 | 5/2015 | Loh | |
| D732,487 S | 6/2015 | Lai et al. | |
| D732,488 S | 6/2015 | Lai et al. | |
| D736,725 S | 8/2015 | Wilcox et al. | |
| D738,542 S | 9/2015 | Hussell et al. | |
| 9,131,561 B2 | 9/2015 | Athalye | |
| D741,538 S | 10/2015 | Ghasabi | |
| 9,159,888 B2 | 10/2015 | Chitnis et al. | |
| 9,277,605 B2 | 3/2016 | Ni | |
| 9,538,590 B2 | 1/2017 | Hussell et al. | |
| 2001/0002139 A1 | 5/2001 | Hiraoka | |
| 2002/0047189 A1 | 4/2002 | Miyaki et al. | |
| 2003/0189830 A1* | 10/2003 | Sugimoto | H01L 25/0753 362/294 |
| 2004/0027761 A1 | 2/2004 | Fukui et al. | |
| 2006/0147746 A1 | 7/2006 | Wakako et al. | |
| 2006/0186418 A1 | 8/2006 | Edmond | |
| 2006/0261357 A1 | 11/2006 | Tsou et al. | |
| 2007/0029664 A1* | 2/2007 | Mohammed | H01L 21/50 257/706 |
| 2007/0062433 A1 | 3/2007 | Hurwitz | |
| 2007/0158668 A1 | 7/2007 | Tarsa | |
| 2007/0252523 A1* | 11/2007 | Maeda | C04B 41/009 313/506 |
| 2008/0043444 A1 | 2/2008 | Hasegawa et al. | |
| 2008/0055901 A1 | 3/2008 | Sanpei et al. | |
| 2008/0173884 A1 | 7/2008 | Chitnis | |
| 2008/0179611 A1 | 7/2008 | Chitnis | |
| 2008/0258130 A1 | 10/2008 | Bergmann | |
| 2009/0045428 A1 | 2/2009 | Lin | |
| 2009/0206718 A1 | 8/2009 | Shimonishi et al. | |
| 2010/0015742 A1 | 1/2010 | Fang et al. | |
| 2010/0078669 A1 | 4/2010 | Cho et al. | |
| 2010/0155763 A1 | 6/2010 | Donofrio | |
| 2010/0193822 A1 | 8/2010 | Inobe et al. | |
| 2010/0212942 A1 | 8/2010 | Tuan et al. | |
| 2011/0111537 A1 | 5/2011 | Cheng et al. | |
| 2011/0170289 A1 | 7/2011 | Allen et al. | |
| 2011/0193109 A1 | 8/2011 | Loh | |
| 2011/0204409 A1 | 8/2011 | Sung et al. | |
| 2011/0260200 A1 | 10/2011 | Chen | |
| 2011/0267732 A1 | 11/2011 | Kuo | |
| 2012/0032226 A1 | 2/2012 | Su et al. | |
| 2012/0177909 A1* | 7/2012 | Uchino | C04B 35/10 428/312.6 |
| 2012/0193649 A1 | 8/2012 | Donofrio | |
| 2012/0193662 A1 | 8/2012 | Donofrio | |
| 2012/0217885 A1 | 8/2012 | Lee | |
| 2012/0250310 A1 | 10/2012 | Hussell et al. | |
| 2012/0299022 A1 | 11/2012 | Hussell | |
| 2012/0313135 A1 | 12/2012 | Kashitani et al. | |
| 2013/0003375 A1 | 1/2013 | Hussell | |
| 2013/0069536 A1 | 3/2013 | Ni | |
| 2013/0200406 A1 | 8/2013 | Hussell | |
| 2013/0214674 A1 | 8/2013 | Inoguchi | |
| 2013/0256710 A1 | 10/2013 | Andrews et al. | |
| 2013/0258658 A1 | 10/2013 | Hussell | |
| 2014/0063818 A1 | 3/2014 | Randolph et al. | |
| 2014/0168981 A1 | 6/2014 | VanStiphout et al. | |
| 2014/0232288 A1 | 8/2014 | Brandes et al. | |
| 2014/0232289 A1 | 8/2014 | Brandes | |
| 2014/0355274 A1 | 12/2014 | Santiago et al. | |
| 2015/0131301 A1 | 5/2015 | Ho | |
| 2015/0257211 A1 | 9/2015 | Johnson et al. | |
| 2015/0282260 A1 | 10/2015 | Hussell et al. | |
| 2016/0161098 A1 | 6/2016 | Tudorica et al. | |
| 2016/0165680 A1 | 6/2016 | Johnson et al. | |

FOREIGN PATENT DOCUMENTS

| | | |
|---|---|---|
| JP | 2001-131517 | 5/2001 |
| JP | 2010-199167 A | 9/2010 |
| JP | 2012-089551 A | 5/2012 |
| KR | 10-0505838 | 10/2005 |
| KR | 20-2008-0002564 U | 7/2008 |
| KR | 20-2011-0008161 U | 8/2011 |
| KR | 10-2011-0104336 | 9/2011 |
| WO | WO 2011/105409 | 9/2011 |
| WO | WO 2012-109225 A1 | 8/2012 |
| WO | WO 2013/148573 | 10/2013 |
| WO | WO 2014/093813 A1 | 6/2014 |
| WO | WO 2015/142537 A1 | 9/2015 |

OTHER PUBLICATIONS

Chinese Office Action for Application No. 2013800183735 dated May 18, 2016.
Notice of Publication for U.S. Appl. No. 14/961,439 dated Jun. 9, 2016.
Notice of Publication for U.S. Appl. No. 14/961,470 dated Jun. 9, 2016.
Non-Final Office Action for U.S. Appl. No. 13/836,940 dated Jul. 21, 2016.

(56) References Cited

OTHER PUBLICATIONS

Notice of Allowance for U.S. Appl. No. 14/639,743 dated Aug. 26, 2016.
Notice of Allowability for U.S. Appl. No. 14/639,743 dated Sep. 20, 2016.
Non-Final Office Action for U.S. Appl. No. 14/961,439 dated Sep. 23, 2016.
Non-Final Office Action for U.S. Appl. No. 13/436,247 dated Nov. 7, 2013.
International Search Report and Written Opininon for Application No. PCT/US2013/074998 dated Apr. 3, 2014.
Restriction Requirement for U.S. Appl. No. 13/836,940 dated Jun. 17, 2014.
Notice of Allowance for U.S. Appl. No. 13/436,247 dated Jun. 18, 2014.
Non-Final Office Action for U.S. Appl. No. 13/836,940 dated Oct. 7, 2014.
Restriction Requirement for U.S. Appl. No. 29/452,692 dated Dec. 4, 2014.
Notice of Allowance for U.S. Appl. No. 29/452,692 dated Apr. 13, 2015.
Final Office Action for U.S. Appl. No. 13/836,940 dated Apr. 17, 2015.
Restriction Requirement for U.S. Appl. No. 13/367,929 dated May 11, 2015.
International Search Report for Application No. PCT/US 2015/018964, dated Jan. 9, 2015.
Notice of Allowance for U.S. Appl. No. 29/452,692 dated Jul. 24, 2015.
Notice of Allowance for U.S. Appl. No. 29/452,692 dated Aug. 7, 2015.
Restriction Requirement for U.S. Appl. No. 14/639,743 dated Sep. 4, 2015.
Non-Final Office Action for U.S. Appl. No. 13/836,940 dated Sep. 11, 2015.
Restriction Requirement for U.S. Appl. No. 29/484,056 dated Nov. 10, 2015.
Abandoned U.S. Appl. No. 29/484,053, filed Mar. 5, 2014.
Non-Final Office Action for U.S. Appl. No. 14/639,743 dated Dec. 31, 2015.
Restriction Requirement for U.S. Appl. No. 29/484,053 dated Jan. 15, 2016.
Final Office Action for U.S. Appl. No. 13/836,940 dated Feb. 12, 2016.
Non-Final Office Action for U.S. Appl. No. 14/221,839 dated Aug. 10, 2016.
Final Office Action for U.S. Appl. No. 13/836,940 dated Jan. 23, 2017.
Notice of Allowance for U.S. Appl. No. 14/961,439 dated Mar. 30, 2017.
Chinese Office Action for Chinese patent application No. 2013800183735 dated Jan. 18, 2017.
Notice of Allowance for U.S. Appl. No. 13/836,940 dated May 18, 2017.
"DuPont Ti-Pure titanium dioxide, Titanium Dioxide for Coatings," Jan. 2012, pp. 1-28, DuPont, USA.
"Technical Guide, Reflectance Materials and Coatings," Jan. 2012, pp. 1-26, Labsphere, USA.
"Thick-Film Ceramic Substrates Design Guide," Mar. 2012, pp. 1-16, CoorsTek, Colorado, USA.
Non-Final Office Action for U.S. Appl. No. 13/435,912 dated Jan. 11, 2013.
Notice of Allowance for U.S. Appl. No. 13/435,912 dated Jun. 19, 2013.
International Search Report and Written Opinion for Application No. PCT/US2013/033704 dated Jun. 26, 2013.
Restriction Requirement for U.S. Appl. No. 13/436,247 dated Aug. 1, 2013.
Chinese Office Action for Application No. 2013800183735 dated Jul. 12, 2017.
Notice of Allowance for U.S. Appl. No. 14/961,439 dated Jul. 18, 2017.
Notice of Allowance for U.S. Appl. No. 13/836,940 dated Jul. 18, 2017.

* cited by examiner

CERAMIC-BASED LIGHT EMITTING DIODE (LED) DEVICES, COMPONENTS, AND METHODS

CROSS REFERENCE TO RELATED APPLICATIONS

This application relates and claims priority to U.S. Provisional Patent Application Ser. No. 61/737,568, filed Dec. 14, 2012. This application is also a continuation-in-part of and claims priority to U.S. patent application Ser. No. 13/367,929, filed Feb. 7, 2012, and Ser. No. 13/436,247, filed Mar. 30, 2012, the disclosures of which are incorporated herein by reference in their entireties.

TECHNICAL FIELD

The subject matter disclosed herein relates generally to components, modules, and methods for light emitting diode (LED) lighting. More particularly, the subject matter disclosed herein relates to devices, components and methods for increasing brightness extracted from and improving the manufacturability of light emitter devices, such as light emitting diodes (LEDs) or LED components.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components and methods can be used in various LED light bulb and light fixture applications, and are developing as replacements for incandescent, fluorescent, and metal halide high-intensity discharge (HID) lighting applications. Conventional light emitter components can utilize one or more LED chips mounted within a component body and sometimes surrounded by a reflector cavity. A ceramic or ceramic-based substrate can be used in association with the one or more LED chips.

Despite the availability of various light emitter components in the marketplace, a need remains for improved LED devices, components and methods.

SUMMARY

In accordance with this disclosure, light emitting diode (LED) devices, components, and methods are provided. It is, therefore, an object of the present disclosure to provide light emitter device components, modules and methods improving adhesion strength and thermal efficiency of the LEDs.

These and other objects as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
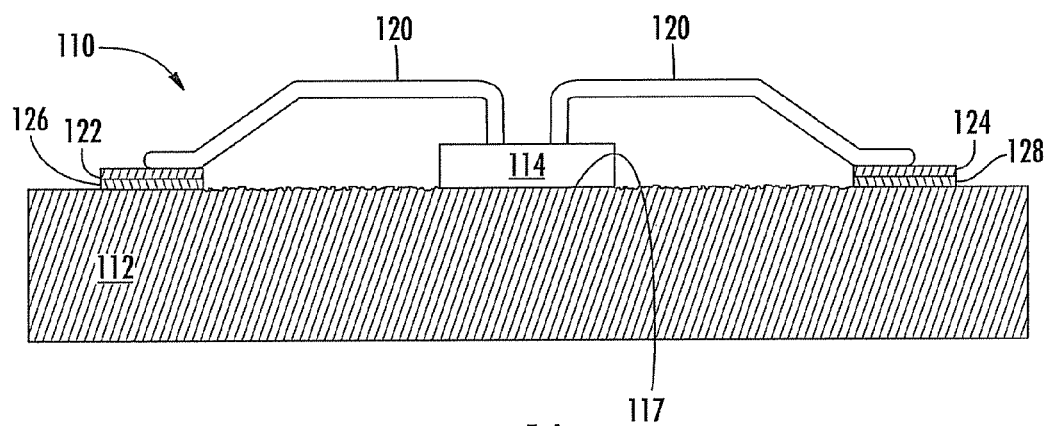
FIGS. 1A and 1B are cross-sectional side views of a light emitter device component according to embodiments of the present subject matter.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," "including," and "having" as used herein should be interpreted as open-ended terms that do not preclude the presence of one or more elements.

Light emitters or light emitting devices according to embodiments described herein can comprise group III-V nitride (e.g., gallium nitride (GaN)) based light emitting diode (LED) chips or lasers that can be fabricated on a growth substrate, for example, a silicon carbide (SiC) substrate, such as those devices manufactured and sold by Cree, Inc. of Durham, North Carolina. Other growth substrates are also contemplated herein, for example and not limited to sapphire, silicon (Si) and GaN. In one aspect, SiC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs or LED chips according to some embodiments of the present subject matter, for example, can be fabricated on growth substrates (e.g., Si, SiC, or sapphire substrates) to provide horizontal devices (with at least two electrical contacts on a same side of the LED chip). Moreover, the growth substrate can be maintained on the LED after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. Examples of horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LED chips can be at least partially coated with one or more phosphors. The phosphors can absorb a portion of the LED chip light and emit a different wavelength of light such that the LED device or package emits a combination of light from each of the LED chip and the phosphor. In one embodiment, the LED device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LED chips of different colors, one or more of which can be white emitting. As understood by those of skill in the art, an encapsulant can be used, such as by dispensing, in association with an LED component or substrate to cover one or more of the LED chips. In this case, any suitable type and color of phosphor can be added to the encapsulant in order to achieve desired light output of a desired color. This type use of phosphor can be instead of or in addition to any phosphor coating of the one or more LED chips.

Figure 1B:
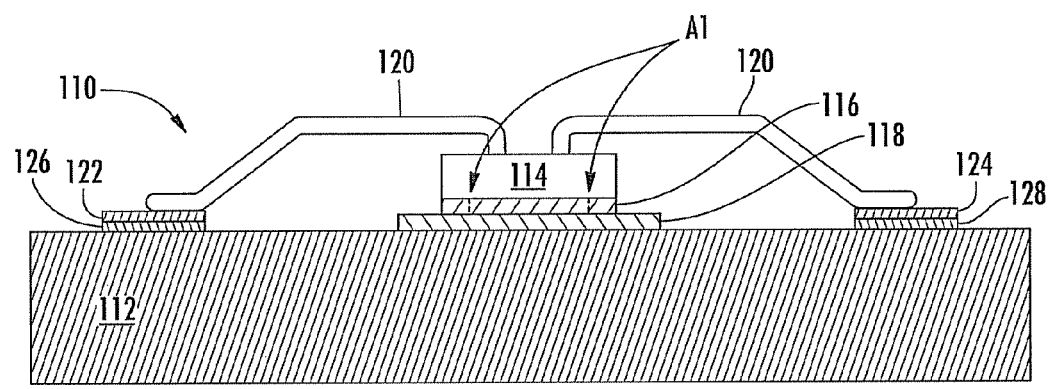

Embodiments of the present subject matter will be described with reference to FIGS. 1A-6B. Referring now to FIGS. 1A and 1B, a light emitter device component can comprise light emitter device components or LED components that can be mounted over a substrate or body (e.g., ceramic) without metal layers at the die attach interface. Generally, it is desirable for the substrate to be highly reflective to visible light (e.g., greater than about 90%) and provide conduction of heat and mechanical support. For example, ceramic materials containing alumina are among the materials that contain these desirable qualities.

FIGS. 1A and 1B each illustrate a light emitter package or LED component, generally designated 110, mounted in this manner. LED component 110 as shown for example in FIG. 1A can comprise a substrate or body 112 that can be of any suitable material, such as ceramic, and can be of any suitable shape and configuration. In comparison to conventional configurations for light emitter device components or LED components that use metal as a reflector (e.g., silver or aluminum), it is believed that ceramic-based LED components can provide improved reflection and thus improved efficiency. Whereas metal reflectors usually produce less than about 95% total reflection (i.e., diffuse plus specular), ceramic-based substrates can have reflectivity beyond 95%.

To further improve the total reflection; at least portions of body 112 can be designed to have increased porosity to further increase the amount of diffuse reflection. For example, desirable improvement in reflection can be achieved with open porosity of between approximately 0 and approximately 15%. Those having skill in the art will recognize that body 112 can be configured to exhibit even higher values of porosity to give brighter results, but such additional improvements in brightness can come at a cost of mechanical stability and thermal performance. As a result, designing body 112 to have a porosity in the range of between approximately 0 to 15% can provide a good balance of these factors. Ceramic materials can further be desirable for use in LED components because of thermal management properties. For example, Alumina materials ($AL_2O_3$) have relatively low thermal resistance, low moisture sensitivity, superior reliability at high temperature environments, and the superior ability to dissipate heat.

In one aspect, body 112 can comprise a ceramic body cast using low temperature co-fired ceramic (LTCC) materials and processes. Specifically, for example, body 112 can comprise a ceramic substrate cast from a thin green ceramic tape. The ceramic tape can comprise any ceramic filler material known in the art, for example, glass ceramics such as aluminum oxide ($Al_2O_3$) or aluminum nitride (AlN) having 0.3 to 0.5 weight percent of glass frits. The glass frits can be used as a binder and/or sintering inhibitor within the ceramic tape when the tape is fired. A green tape can be formed by casting a thick layer of a slurry dispersion of the glass frit, ceramic filler, one or more additional binders, and a volatile solvent. The cast layer can be heated at low temperatures to remove the volatile solvent. A green ceramic tape used for body 112 can advantageously comprise any thickness desired, thus contributing to a thinner size when desired.

In another aspect, HTCC can be used. Body 112 can further comprise a ceramic material having any of a variety of scattering particle contained therein. Examples of suitable scattering particles can for example comprise particles of $Al_2O_3$, $TiO_2$, $BaSO_4$, and/or AlN. In one particular embodiment, $Al_2O_3$ particles can be selected based on cost considerations, along with its mechanical, optical, electrical, and thermal properties. In still another aspect, the substrate can be a comparatively simple structure without intervening layers such as those produced by thin- or thick-film processes (e.g., bare substrates produced CoorsTek and several others). Such substrates can be fired along with other materials (e.g., Zirconia) to improve optical and mechanical properties. Body 112 can instead comprise any other suitable material or materials, and any suitable layer or portion, such as for example a non-metallic layer, can be disposed on or over body 112.

Figure 2A:
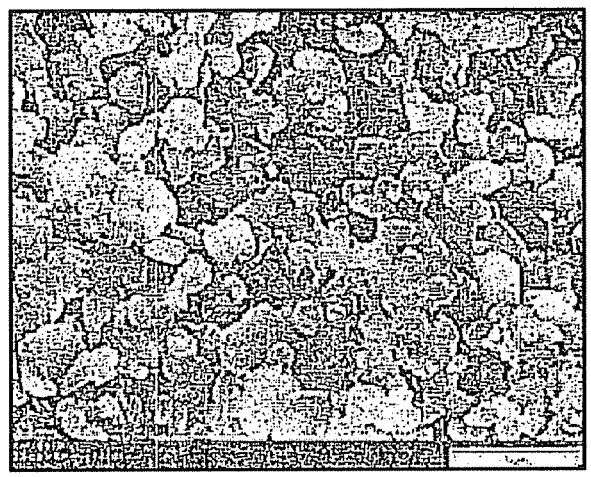
FIG. 2A is a magnified image of a ceramic substrate with a substantially unmodified surface.
Figure 2B:
FIG. 2B is a magnified image of a ceramic substrate with a lapped surface according to an embodiment of the present subject matter.
Figure 2C:
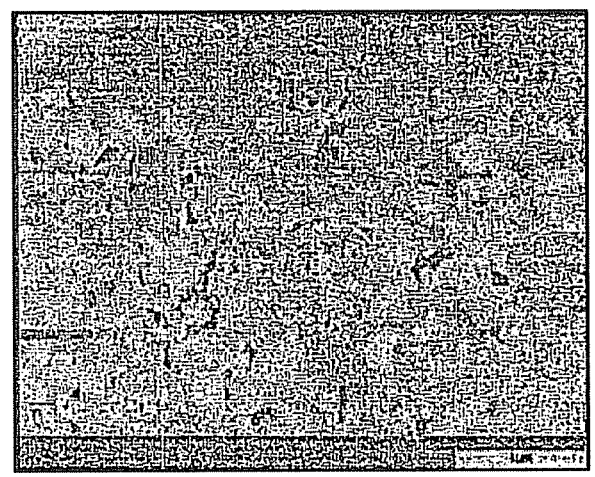
FIG. 2C is a magnified image of a ceramic substrate with a polished surface according to an embodiment of the present subject matter.

Despite these advantages, however, as-fired ceramic materials generally have a surface that is porous and rough, such as is shown in FIG. 2A. Although this profile can provide good reflection properties as discussed above, those having skill in the art will recognize that these characteristics are often not considered optimal for attaching an LED die. Specifically, for instance, both the adhesion strength and the thermal resistance can be affected. To address these issues, any of a variety of surface modifications can be used to improve the surface profile of body 112 to receive LED component 114. First, for example, lapping, polishing, and/or other mechanical modification processes can be applied to at least a portion or surface of body 112 to offer some improvement by smoothing the contact surface to thereby increase the contact area with LED component 114. For instance, FIG. 2B shows a ceramic surface that has been modified by lapping, and FIG. 2C shows a ceramic surface that has been modified by polishing. Regardless of the specific mode by which the contact surface is smoothed, the increased contact area can thereby result both in greater adhesion strength and better thermal contact. Such mechanical processes can result in contaminants being trapped within the surface, however, which can negatively affect the reflection properties of the surface.

Alternatively, a coating can be applied to the surface of body 112. The coating can be selected based on any of a variety of characteristics, such as good surface morphology or thermal conductance. The coating can preferably be selected to improve thermal contact and adhesion without significantly reducing the reflection from the surface. Examples of a coating that can provide such improvement to the ceramic surface can include silicone, epoxy, or another polymer known to those having skill in the art. Alternatively, the coating can comprise a ceramic material. In addition, the coating can contain reflective particles therein, such as alumina, titanium, dioxide, zirconia, or any other reflective particle known to those having skill in the art. The coating can be fired with a flux or without a flux (i.e., in a sintering process). Furthermore, once applied, the coating can itself be mechanically modified, such as by lapping, polishing, or other mechanical modification.

Regardless of how the surface profile of body 112 is smoothed, however, the result can be a surface that provides greater adhesion and better thermal contact with LED component 114. Such a surface modification can be provided only in particular regions of the surface of body 112, such as at positions where LED component 114 will be attached as shown in FIG. 1A (i.e., the surface is modified at a die attach interface 117, but the remainder of the surface is comparatively rough), or the entire upper surface of body 112 can be modified as shown in FIG. 1B. Similarly, at least a portion of the surface that opposes the side to which LED component 114 is attached (i.e., the "bottom" surface) can likewise be lapped, polished, coated, or otherwise modified to improve the thermal contact and/or adhesion strength for any components attached thereto. Of course, it should be recognized that other combinations of component configurations and surface modifications beyond those shown in FIGS. 1A and 1B are within the scope of the present subject matter.

Referring again to FIGS. 1A and 1B, body 112 can for example be formed with or without any cavity or recess so that one or more LED chips 114 are disposed on and can mount to body 112. As one example, body 112 can comprise a surface, such as an upper surface, that can but does not have to be disposed along a single plane. The one or more LED chip(s) such as LED chip 114 can be mounted directly to the surface of body 112 with only a thin adhesive layer (e.g., silicone or epoxy) between body 112 and LED chip 114 (i.e., without any intervening layer, such as a metal or other layer, as shown for example in FIG. 1A). Alternatively, the one or more LED chip(s) such as LED chip 114 can be mounted indirectly to the surface of body 112 as shown for example in FIG. 1B where LED chip 114 is mounted to a first intervening layer 116 that can be a non-metallic layer or a metallic layer. One or more than one intervening layer can be used and all of them can be non-metallic layers. For example and without limitation, a second, intervening layer 118 can also be disposed between body 112 and LED chip 114 as shown in FIG. 1B where second intervening layer 118 is below and against first intervening layer 116. In particular, second intervening layer 118 can be a coating of material that improves the thermal contact and the ability of LED chip 114 and first intervening layer 116 to be adhered to body 112 as discussed above. The one or more intervening layer(s) can be of a width that is identical to, less than or greater than the width of LED chip 114. As an example, second intervening layer 118 is shown with a width that is wider than that of LED chip 114, and arrows A1 in FIG. 1B indicate broken lines to illustrate where first intervening layer 116 could extend to instead as one example where first intervening layer 116 would have a width that is less that the width of LED chip 114.

In either arrangement, LED chip 114 can be electrically connected, such as by wirebonds 120 or any other suitable technique, to one or more electrical components. As used herein, electrical components can, for example and without limitation, comprise electrical traces, leads, electrical pads, contact or bond pads, or any other suitable electrical component. For example, first and second electrical components 122 and 124 can each comprise a copper foil having wire-bondable gold or silver portions provided thereon. One of the first and second electrical components 122 and 124 can serve as a cathode and the other as an anode for supplying LED chips 114 with current to illuminate an active layer within the LED chip. Alternatively, LED chip 114 may be flip-chip bonded to the first and second electrical components. Any other suitable bonding techniques could be used as well. Regardless of the specific connection, first and second electrical components 122 and 124 can be separated from body 112 by one or more non-metallic layers. For instance, as shown in FIGS. 1A and 1B, optionally adhesive layers 126 and 128 can be positioned between body 112 and first and second electrical components 122 and 124, respectively. For example, adhesive layers 126 and 128 can each comprise an organic-based adhesive, a pressure-sensitive adhesive (PSA), and/or an epoxy, a Room Temperature Vulcanizing (RTV) silicone, or silicone adhesive.

By connecting LED chips 114 and first and second electrical components 122 and 124 to body 112 using non-metallic layers (e.g., first and second intervening layers 116 and 118, adhesive layers 126 and 128), the manufacturability of LED component 110 can be greatly improved. Specifically, for example, prior art methods require resource-intensive processes in which a seed layer is deposited on the substrate by physical vapor deposition or the like, and copper is plated on the seed layer to produce electrical traces on the substrate. Other metals are typically plated on the copper to make them wire-bondable. Such methods can require a number of additional processing steps with respect to body 112, and these additional processing steps can leave contaminates on the ceramic surface, which can be difficult to remove and can negatively impact the performance (e.g., brightness) and reliability of the device. In contrast, using one or more intervening non-metallic layers as discussed herein, first and second electrical components 122 and 124 can be adhered to body 112 in a comparatively simpler process. In such a configuration, the trace pattern can be formed separate from substrate 112 and applied using a lamination technique, such as for example a heat press and/or an overpressure chamber (i.e., autoclave) lamination technique with an adhesive film known to those having skill in the art in the multi-layer printed circuit board industry.

Figure 3A:
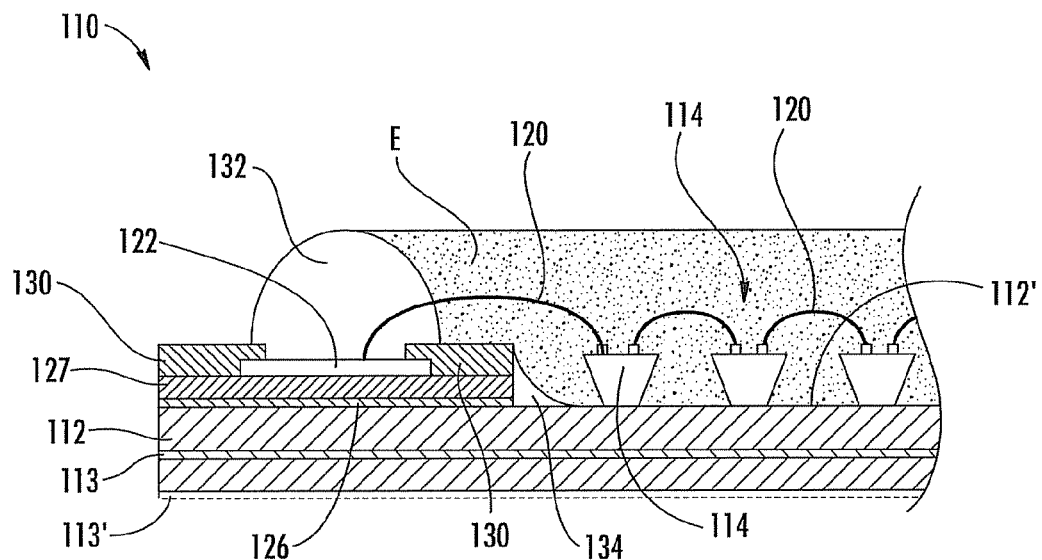
FIGS. 3A and 3B are cross-sectional side views of a light emitter device component according to further embodiments of the present subject matter.

Further in this regard, in an alternative configuration shown in FIG. 3A, LED component 110 can comprise an additional dielectric layer 127 positioned between body 112 and first electrical component 122. Likewise, although not shown in FIGS. 3A or 3B, a similar dielectric layer can be positioned between body 112 and any other electrical components (e.g., second electrical component 124). Dielectric layer 127 can be any of a variety of material layers known in the art, such as a copper clad laminate (CCL) (e.g., glass-reinforced FR-4, CEM-3, CEM-4, or other related composite materials, such as CS-3965 from Risho). In one particular embodiment, for example, dielectric layer 127 can be a flexible printed circuit board ("flextape" PCB) comprising a polymer-like film having at least one conductive layer within one or more layers of a flexible plastic resin (e.g., polyimide, Kapton from DuPont). In this exemplary configuration, adhesive layer 126 can comprise a tape-like adhesive provided on the flextape for easy connection to body 112. It should be recognized, however, that dielectric layer 127 can comprise any material used in multilayer PCBs or flex PCBs, including prepreg materials, reinforced laminates (e.g., glass-reinforced epoxy, materials using carbon fiber), and non-reinforced materials.

As further illustrated in FIG. 3A, additional components can be integrated into LED component 110 to improve the performance and manufacturability thereof. For example, LED component 110 can further comprise an electrically insulating solder mask 130, which can be disposed on dielectric layer 127 and at least partially on electrical components 122 and 124 such that when solder is used to attach one or more wires to an electrical solder pad (not shown), the solder will be contained within the predefined area. Choosing a white solder mask can improve the overall reflectivity of LED component 110. Similarly, a fillet 134 can be provided around a perimeter of a light emitting area defined above the top surface of body 112, which can be either transparent or reflective (e.g., white). For example, fillet 134 can be made white by incorporating $TiO_2$ particles therein or by forming fillet 134 of silicone or epoxy materials. Regardless of the specific configuration, fillet 134 can improve reflection of the sidewall portions of LED component 110, thereby compensating in configurations where dielectric layer 127 has a comparatively lesser reflectivity (e.g., where dielectric layer 127 comprises FR-4). Exemplary configurations for LED component 110 having such a fillet 134 can be found in commonly owned U.S. patent application Ser. No. 13/435,912, filed Mar. 30, 2012, the disclosure of which is incorporated by reference in its entirety herein.

LED component 110 can further comprise a retention material 132 disposed at least partially about an emission area in which LED chip 114 is positioned, where retention material 132 can be referred to as a dam. After placement of retention material 132, an encapsulant E can be disposed within the recess formed thereby. Encapsulant E can contain one or more phosphors such that light emitted from the one or more LED chips 114 can produce an emission with desired spectra. Encapsulant E can be selectively filled to any suitable level within the space disposed between one or more inner walls of retention material 132. For example, encapsulant E can be filled to a level equal to the height of retention material 132 or to any level above or below the retention material. The level of encapsulant E can be planar or curved in any suitable manner, such as concave or convex.

Figure 3B:
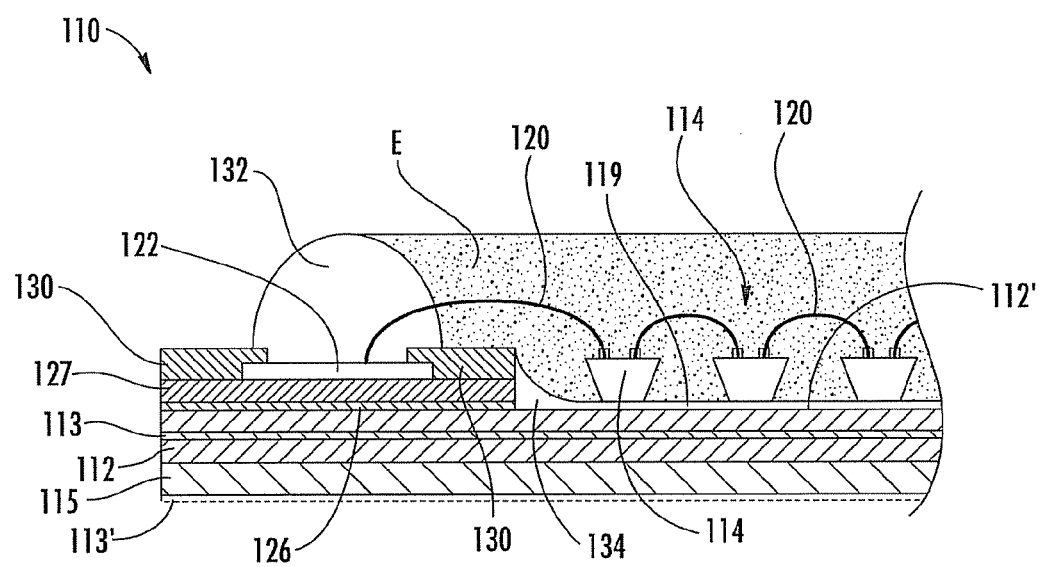

As discussed above, at least a portion of the top surface of body 112 can be lapped, polished, coated, or otherwise modified to diminish the rough, porous surface profile that is common to ceramics. Specifically, as shown in FIG. 3A, a top surface 112' of body 112 can be improved by lapping, polishing, or other mechanical modification. Alternatively, as shown in FIG. 3B, a coating 119 that does not significantly reduce reflection but has good surface morphology and thermal conductance can be applied to top surface 112'. As shown in FIG. 3B, coating 119 can merge with fillet 134 and be composed of the same materials (e.g., silicone, epoxy), or coating 119 can alternatively be a separate element and can have a different composition than fillet 134. Regardless of the specific configuration, the improvement of top surface 112' can provide greater adhesion and better thermal contact with the one or more LED chips 114.

LED component 110 can also comprise a reflective layer 113 that can, for example and without limitation, be positioned and disposed within body 112 as shown in FIG. 3A. In another aspect, reflective layer 113' can as shown in FIG. 3A in broken lines optionally instead only be positioned and disposed on a bottom surface of body 112 (i.e., a surface opposing the top surface on which one or more LED chips 114 are disposed). Reflective layers 113 or 113' can, for example, comprise a metal reflector (e.g., a silver layer), a white thermal compound, or any other material known to limit loss through the bottom surface of body 112, thereby further improving total reflection of LED component 110. Reflective layers 113 or 113' can comprise metal or a dielectric material and can for example be two ceramic or other reflective materials bonded together. Much of the light not initially reflected by the highly reflective body 112 can be transmitted to a different surface of body 112 (e.g., a back or bottom surface), so reflective layers 113 or 113' can further advantageously assist in recovery of such light for example.

Furthermore, additional material layers can be provided in combination with body 112 to define a multi-layer substrate. As shown in FIG. 3B, for example, at least one additional substrate layer 115 can be provided in combination with body 112. In this configuration, the combination of material layers can define a gradient in which body 112 can comprise a comparatively denser layer with optimized thermal conductivity (e.g., a sapphire layer), whereas substrate layer 115 can exhibit comparatively improved reflection. In this regard, substrate layer 115 can have a comparatively higher degree of porosity with respect to body 112 such that substrate layer 115 exhibits a higher degree of diffuse reflectivity. For example, the degree of porosity in substrate layer 115 can be approximately equal to or greater than approximately twice the degree of porosity in body 112. This configuration can allow heat to dissipate away from the die while still producing a high degree of total reflection.

In some aspects, light produced by LED chip 114 can penetrate farther into the multi-layer substructure before being reflected back into the epi-layers that can re-absorb the light. This configuration can also comprise a reflective layer 113 that can, for example and without limitation, be positioned and disposed within body 112. In another aspect, reflective layer 113' can as shown in broken lines in FIG. 3B optionally instead only be positioned and disposed on a bottom surface of substrate layer 115. Reflective layers 113 or 113' can for example comprise a metal reflector (e.g., a silver layer), a white thermal compound, or any other material known to limit loss, thereby further improving total reflection of LED component 110. Reflective layers 113 or 113' can comprise metal or a dielectric material and can for example be two ceramic or other reflective materials bonded together.

Figure 4:
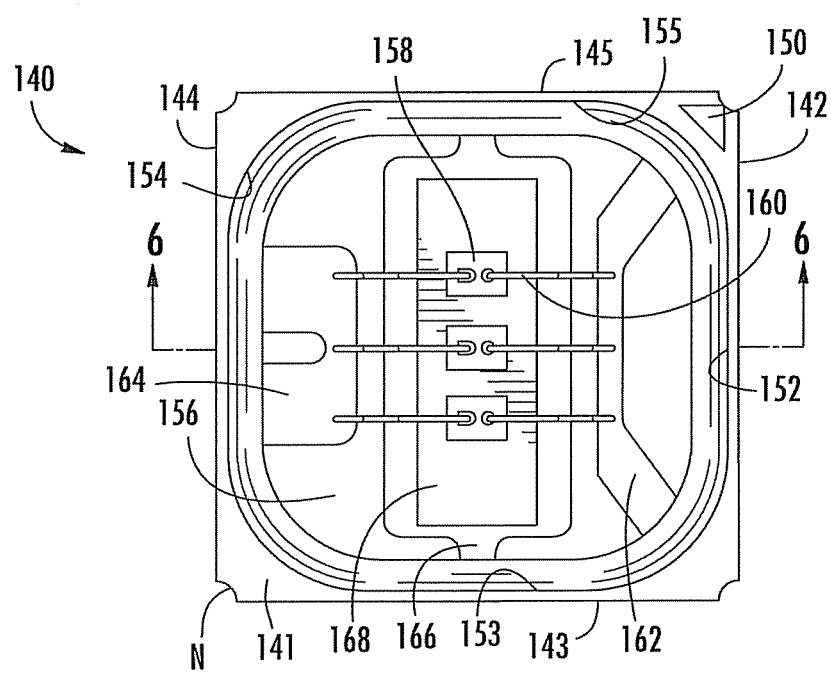
FIG. 4 is a top view of a light emitter device component according to the present subject matter.
Figure 5:
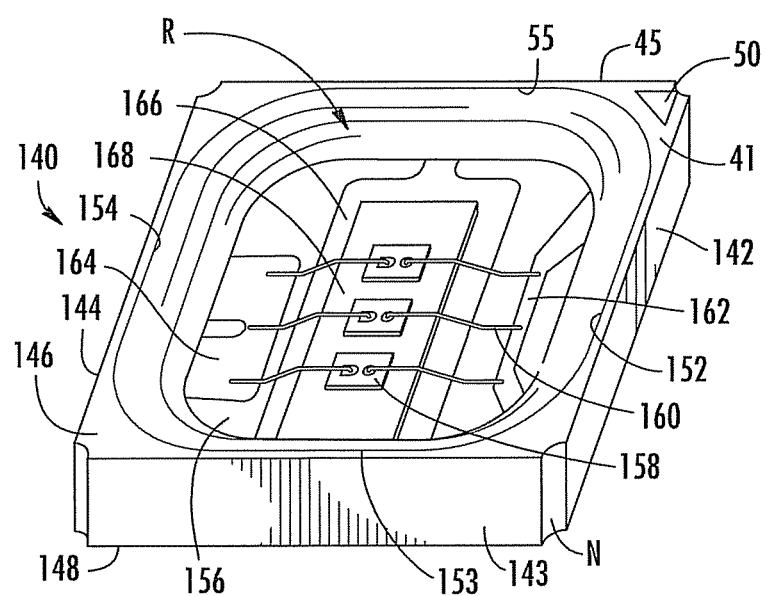
FIG. 5 is a perspective view of a light emitter device component according to the present subject matter.

Referring now to FIGS. 4 to 6B, further alternative configurations for a light emitter device component comprising a ceramic-based LED configuration such as those discussed above can incorporate a recess that can be defined by walls forming an opening. FIGS. 4 and 5 illustrate a light emitter package or LED component, generally designated 140, comprising a package body 141 formed by outer walls 142, 143, 144, and 145. Package body 141 can comprise any material known in the art. For example, body 141 can comprise molded plastic, ceramic, thermoset, silicone and/or thermoplastic materials or any combination of these or other materials. Similarly to the configurations described above, body 141 can comprise a ceramic body cast using low temperature co-fired ceramic (LTCC) materials and processes, or HTCC can be used.

Outer walls 142 to 145 of LED component 140 can, for example only and without limitation, form a substantially square body 141. The shape can also be any other shape or configuration, such as a rounded shape or configuration. Outer walls 142 to 145 can comprise one or more notches N at the corners of body 141. LED component 140 can comprise a top surface 146 and a bottom surface 148. One corner of LED component 140 can comprise a mark 150 for identifying electrical characteristics for a particular side of LED component 140. For example, mark 150 can designate the side of the component comprising the anode or cathode.

LED component 140 can further comprise one or more inner walls defining a recess generally designated R. Here, inner walls 152, 153, 154, and 155 define recess R within body 141. Inner walls 152 to 155 can comprise substantially squared or rounded corners where the inner walls meet. Optionally, component 140 may comprise a single inner wall defining a substantially circular recess therein. Optionally, inner walls 152 to 155 can be coated with a reflective material, such as silver, to further increase the amount of light extracted per LED component 140.

One or more light emitters such as LEDs or LED chips 158 can mount to or be disposed above lower surface 156. An LED chip 158 can mount upon one or more intervening layers as shown for example in FIG. 6A, or alternatively an LED chip can mount directly upon lower surface 156 without any intervening layer or layers as shown for example in FIG. 6B. Lower surface 156 of LED component 140 can comprise a first electrical component 162 and a second electrical component 164 separated from lower surface 156 by first and second non-metallic layers 163 and 165, respectively. First and second electrical components 162 and 164 can each comprise a conductive material (e.g., silver metal) that is coupled to but physically separated from lower surface 156 by first and second non-metallic layers 163 and 165, respectively. The one or more LED chips 158 can electrically connect to first and second electrical components 162 and 164 using conductive wires 160 formed using a wirebonding process. One of the first and second electrical components 162 and 164 serves as a cathode and the other as an anode for supplying the LED chips 158 with current to illuminate an active layer within the LED chip. Alternatively, the LED chips 158 may be flip-chip bonded to the first and second electrical components. Any other suitable bonding techniques could be used as well.

LED component 140 can further comprise a thermal component 166. Thermal component 166 can assist with managing thermal properties of LED component 140 by spreading and conducting heat away from the one or more LED chips 158. In particular, as discussed above, thermal component 166 can be a coating of material that improves the thermal contact and the ability of LED chips 158 to be adhered to body 141. Thermal component 166 can comprise one or more additional layers 168 to further improve heat spreading and thermal management capabilities of LED component 140. For example, additional layers 168 can comprise a die-attach layer. Using HTCC or any other suitable thermally conducting substrate may reduce any need to use added thermal components.

Figure 6A:
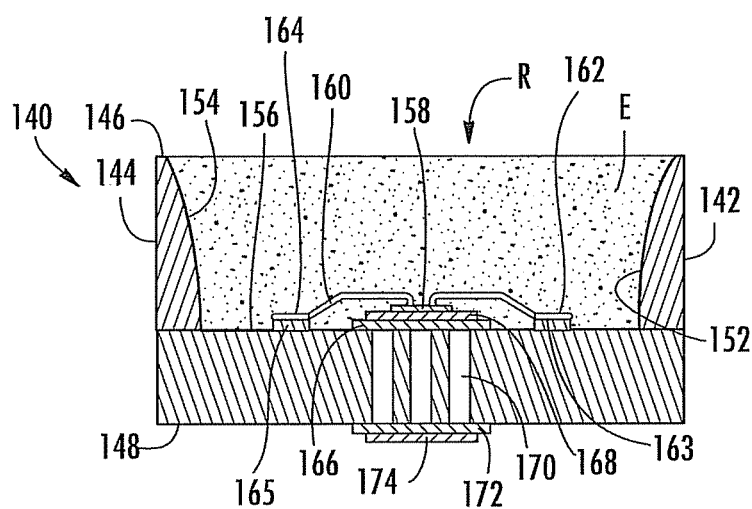
FIG. 6A is a cross-sectional view of a light emitter device component along line 6-6 of FIG. 4.

Referring now to the cross-sectional view of FIG. 6A, taken along line 6-6 of FIG. 4, features of LED component 140 are further illustrated. In this view recess R is defined by inner and outer walls 152, 154, 142, and 144, respectively. The opening of recess R can be as large as possible without extending all the way to the edge of the outer walls 142 and 144. Encapsulant E can be disposed within the recess, and can contain one or more phosphors such that light emitted from the one or more LED chips 158 produces an emission of desired output spectra. Encapsulant E, with or without phosphor included or later added, can be filled to any level within recess R, for example, flush with the top surface 146 of LED component 140.

One or more LED chips 158 can electrically connect to first and second electrical components 162 and 164, respectively, by wirebonding using electrically conductive wire 160. LED chips 158 can mount within recess R upon one or more thermal components 166 comprising one or more additional thermally conductive layers 168. One or more intervening layers such as, for example, conductive layer 168, can then be deposited by any suitable technique upon the thermal components.

At least one thermally conductive via 170 can be disposed, or buried, within body 141 and further disposed between thermal component 166 and a thermal pad 172 extending from bottom surface 148 of LED component 140. Thermal pad 172 can further spread the heat dissipated from LED component 140 and can conduct the heat into an external heat sink. Thermal pad 172 can comprise any suitable shape, size, and/or geometry known in the art. In one aspect, multiple conductive thermal vias 170 can be used to dissipate the heat released from the one or more LED chips 158. Conductive thermal vias 170 can conduct heat away from LED component 140 by causing heat to flow on a path out from the one or more LED chips 158, into thermal element 166 and any intervening layers, such as conductive layer 168, through body 141, out from thermal pad 172, and into an external heat sink (not shown). The external heat sink can comprise a printed circuit board (PCB) or other external element upon to which the LED component 140 may thermally and electrically connect. Conductive thermal vias 170 can comprise any thermally conductive material known in the art, for example silver metal, which can assist in minimizing junction temperature difference between the LED chip(s) and the external sink, thus prolonging the life of LED component 140.

Figure 6B:
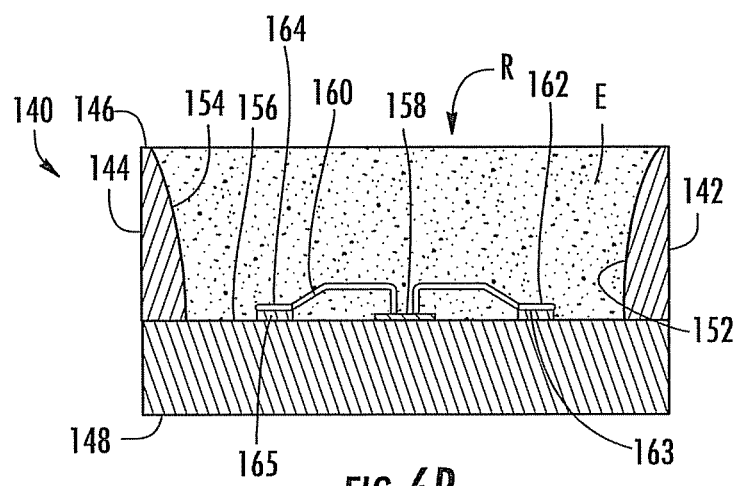
FIG. 6B illustrates a cross-sectional view of another embodiment of the light emitter device component.

As shown for example and without limitation in FIG. 6B, one or more LED chip 158 can mount within recess R directly upon lower surface 156 without any intervening layer. As one example, LED chip 158 can be mounted directly upon lower surface 156 without an intervening layer or structure such as thermal component 166 or a conductive layer 168. In such a configuration, lower surface 156 can be lapped, polished, coated, or otherwise modified as discussed above to improve the thermal contact and/or adhesion strength for any components attached thereto. LED component 140 shown in FIG. 6B can but does not have to comprise a conductive thermal via 170 or thermal pad 172 or a protruding layer 174 shown in FIG. 6A. Otherwise, LED component 140 as shown in FIG. 6B can comprise identical features and structures to the embodiment shown in FIG. 6A.

Embodiments of the present disclosure shown in the drawings and described above are exemplary of numerous embodiments that can be made within the scope of the appended claims. It is contemplated that the configurations of LED components such as those disclosed herein can comprise numerous configurations other than those specifically disclosed.

What is claimed is:

1. A light emitter device component comprising:
    a substrate comprising a ceramic material layer having a porosity of greater than 0% but less than approximately 15%, the porosity of the substrate being configured to produce a total reflection of visible light of greater than 95%, wherein a top surface of the ceramic material layer is disposed along a single plane, at least a portion of the top surface of the ceramic material layer having been modified by lapping, polishing, and/or another mechanical modification to have a reduced porosity compared to an as-fired ceramic body;
    one or more light emitter devices mounted on the portion of the top surface; and
    one or more electrical components mounted on the portion of the top surface by one or more non-metallic adhesive layers and electrically coupled to the one or more light emitter devices.

2. The light emitter device component according to claim 1, wherein the substrate comprises a thick-film ceramic substrate.

3. The light emitter device component according to claim 1, wherein the substrate comprises a thin-film ceramic substrate.

4. The light emitter device component according to claim 1, wherein the portion of the top surface has a reduced porosity, and a remainder of the top surface has an unmodified porosity.

5. The light emitter device component according to claim 4, wherein the portion of the top surface has a porosity that is approximately equal to or less than approximately half of a porosity of the remainder of the top surface.

6. The light emitter device component according to claim 1, wherein substantially all of the top surface has a reduced porosity compared to an as-fired ceramic body.

7. The light emitter device component according to claim 1, wherein the substrate comprises a bottom surface opposing the top surface, at least a portion of the bottom surface having a reduced porosity compared to an as-fired ceramic body.

8. A method of forming a light emitter device component having increased brightness, the method comprising:
    mechanically modifying at least a portion of a top surface of a substrate comprising a ceramic material layer having a porosity of greater than 0% but less than approximately 15%, the top surface of the substrate being disposed along a single plane, the porosity of the substrate being configured to produce a total reflection of visible light of greater than 95%, wherein mechanically modifying at least a portion of the substrate comprises lapping, polishing, and/or another mechanical modification such that the top surface of the ceramic material layer has a reduced porosity compared to an as-fired ceramic body;
    mounting one or more light emitter devices on the portion of the top surface that is modified;
    providing one or more non-metallic adhesive layers on the top surface of the substrate; and
    mounting one or more electrical components to the one or more non-metallic adhesive layers.

9. The method of claim 8, wherein the ceramic material layer comprises a thick-film ceramic material layer.

10. The method of claim 8, wherein the ceramic material layer comprises a thin-film ceramic material layer.

11. The method of claim 8, comprising modifying substantially all of the top surface of the ceramic material layer to have a reduced porosity compared to an as-fired ceramic body.

12. The method of claim 8, comprising modifying at least a portion of a bottom surface opposing the top surface of the ceramic material layer to have a reduced porosity compared to an as-fired ceramic body.

13. The method of claim 8, wherein the one or more electrical components are spaced from the substrate by the one or more non-metallic layers.

* * * * *